(12) United States Patent
Chavez et al.

(10) Patent No.: US 11,996,425 B2
(45) Date of Patent: May 28, 2024

(54) PHOTOSENSITIVE ELEMENT AND OPTOELECTRONIC COMPONENT

(71) Applicant: First Sensor AG, Berlin (DE)

(72) Inventors: Ruben Chavez, Berlin (DE); Martin Wilke, Berlin (DE); Marc Schillgalies, Berlin (DE); Iman Sabri Alirezaei, Berlin (DE); Michael Pierschel, Berlin (DE)

(73) Assignee: First Sensor AG, Berlin (DE)

( * ) Notice: Subject to any disclaimer, the term of this patent is extended or adjusted under 35 U.S.C. 154(b) by 0 days.

(21) Appl. No.: 18/155,831

(22) Filed: Jan. 18, 2023

(65) Prior Publication Data

US 2023/0268359 A1   Aug. 24, 2023

(30) Foreign Application Priority Data

Jan. 18, 2022 (EP) .................................... 22151991

(51) Int. Cl.
*H01L 27/146* (2006.01)
*G01S 7/481* (2006.01)

(52) U.S. Cl.
CPC ........ *H01L 27/1462* (2013.01); *G01S 7/4814* (2013.01); *G01S 7/4816* (2013.01); *H01L 27/14603* (2013.01); *H01L 27/14623* (2013.01); *H01L 27/14636* (2013.01); *H01L 27/14649* (2013.01)

(58) Field of Classification Search
CPC ..... H01L 27/146; H01L 27/144; H01L 33/40; H01L 33/42; H01L 31/02

USPC ............................................... 250/239, 214.1
See application file for complete search history.

(56) References Cited

U.S. PATENT DOCUMENTS

| 5,081,347 | A | 1/1992 | Matsumoto |
| 2006/0220078 | A1 | 10/2006 | Bui et al. |
| 2011/0068426 | A1* | 3/2011 | Zheng ................ H01L 27/1446 257/E31.127 |
| 2019/0006399 | A1 | 1/2019 | Otake et al. |

FOREIGN PATENT DOCUMENTS

EP   2466341 A1   6/2012

OTHER PUBLICATIONS

Extended European Search Report, Application No. 22151991.1-1002, dated Jun. 20, 2022, 9 pages.

* cited by examiner

*Primary Examiner* — Que Tan Le
(74) *Attorney, Agent, or Firm* — Barley Snyder

(57) ABSTRACT

A photosensitive element includes a semiconductor substrate, a light sensitive region formed in the semiconductor substrate, an inactive region at least partly surrounding the light sensitive region, and a protective layer having an opening leaving the light sensitive region uncovered by the protective layer. The protective layer is an anti-reflective coating having in at least a part of a spectral range between 300 nm and 1200 nm a reflectivity of less than 10% and a transmittance of less than 0.1%.

17 Claims, 4 Drawing Sheets

PHOTOSENSITIVE ELEMENT AND OPTOELECTRONIC COMPONENT

CROSS-REFERENCE TO RELATED APPLICATION

This application claims the benefit of the filing date under 35 U.S.C. § 119(a)-(d) of European Patent Application No. 22151991.1, filed on Jan. 18, 2022.

FIELD OF THE INVENTION

The present disclosure relates to a photosensitive element and to an optoelectronic component comprising at least one such photosensitive element.

BACKGROUND

Optoelectronic components are, for instance, known in the field of safety devices for industrial automation or automotive applications, but also for consumer products such as smartphones.

In particular, LIDAR (light detection and ranging) technology will be used in advanced driver-assistance systems (ADAS) and is the key technology for enabling autonomous driving. In these LIDAR systems, there are different detector styles used which are based on different photosensitive elements like avalanche photodiodes (APDs) and silicon photomultipliers (SiPM).

APDs are diode devices, which may be based on silicon and which have a very compact size, high quantum efficiency and relatively high gain.

A reach-through APD is made of an intrinsic or lightly doped p-type semiconductor, sandwiched between two heavily doped p and n-type regions with a p-type region between the intrinsic and n-type region. By using a highly doped silicon crystal, a very high internal field is maintained across the p-n-junction which produces a high internal gain. Heavily doped p and n-regions work as a contact which is connected with metal contacts. Through these metal contacts, an external high reverse bias voltage is supplied.

The heavily doped p-region is made as thin as possible and is working as a window for the incident light. From this electron hole pair, the electron moves towards the n region where it becomes subject to a high field and gains enough energy to release secondary electrons. These secondary electrons also gain energy in this high field to release tertiary electrons as the process goes on and an avalanche occurs. This results in an internal gain that induces a current pulse high above the noise level and can be read out through the electrodes of the diode.

Due to their high sensitivity, APDs are susceptible to so-called ghost signals which result from internal reflections of the incident radiation.

It has been experimentally shown that the current design of APDs, in which the non-active area of the detector is covered with a metal, leads to false positive signals and a reduced signal to noise ratio (SNR). The source of these effects is mainly that light is reflected diffusively by the metal into the optical active area. Furthermore, specifically for automotive applications, very high demands have to be met regarding shelf-life, long term stability, and robustness under challenging environmental conditions. In particular, the requirements of the Automotive Electronics Council (AEC) are advantageously fulfilled. Regarding the qualification of discrete optoelectronics, the AECQ-102 qualification (AEC—Q102—Rev A Apr. 6, 2020) is pertinent. The AEC Component Technical Committee is the standardization body for establishing standards for reliable, high quality electronic components. Components meeting these specifications are suitable for use in the harsh automotive environment without additional component-level qualification testing.

In order to avoid damages and failure of the photosensitive element and thus the optoelectronic component, when operating under atmospheric conditions, protective layers are used as passivation against corrosion effects. Applying such passivation layers involves additional manufacturing steps and thus enhances the fabrication complexity and costs. A technology reducing internal reflections and providing protection against environmental influences would therefore be particularly desirable.

Consequently, there is still a need to improve existing photosensitive elements and optoelectronic components, in order to alleviate or overcome the disadvantages of conventional technologies and provide a significant reduction of manufacturing costs and the complexity, and improve the accuracy and operational stability.

SUMMARY

A photosensitive element includes a semiconductor substrate, a light sensitive region formed in the semiconductor substrate, an inactive region at least partly surrounding the light sensitive region, and a protective layer having an opening leaving the light sensitive region uncovered by the protective layer. The protective layer is an anti-reflective coating having in at least a part of a spectral range between 300 nm and 1200 nm a reflectivity of less than 10% and a transmittance of less than 0.1%.

BRIEF DESCRIPTION OF THE DRAWINGS

The invention may be understood by reference to the following description taken in conjunction with the accompanying figures, in which.

DETAILED DESCRIPTION OF THE EMBODIMENT(S)

The accompanying drawings are incorporated into the specification and form a part of the specification to illustrate several embodiments of the present invention. These drawings, together with the description, explain the principles of the invention. The drawings are merely for the purpose of illustrating examples of how the invention can be made and used, and are not to be construed as limiting the invention to only the illustrated and described embodiments. Furthermore, several aspects of the embodiments may form— individually or in different combinations—solutions according to the present invention. The following described embodiments thus can be considered either alone or in an arbitrary combination thereof. Further features and advantages will become apparent from the following more particular description of the various embodiments of the invention, as illustrated in the accompanying drawings, in which like references refer to like elements.

The present disclosure is based on the idea to provide an anti-reflective coating which at the same time has a low reflection and a high absorption in those regions of the photosensitive element which are not active.

The term "active region" is intended to mean the sensitive region of a photosensitive element, into which the radiation enters for being detected. As mentioned above, for an APD, the active region is the heavily doped p-region which is working as a window for the incident light.

The term "light" is intended to mean electromagnetic radiation in an ultraviolet to infrared spectral range, in other words, not necessarily in a visible spectral range.

The term "protective layer" is intended to mean a layer that protects the photosensitive element against reflection of light, and/or chemical or physical deteriorating influences leading to corrosion or the like.

The present invention will now be explained in more detail with reference to the Figures and firstly referring to FIG. 1.

Figure 1:
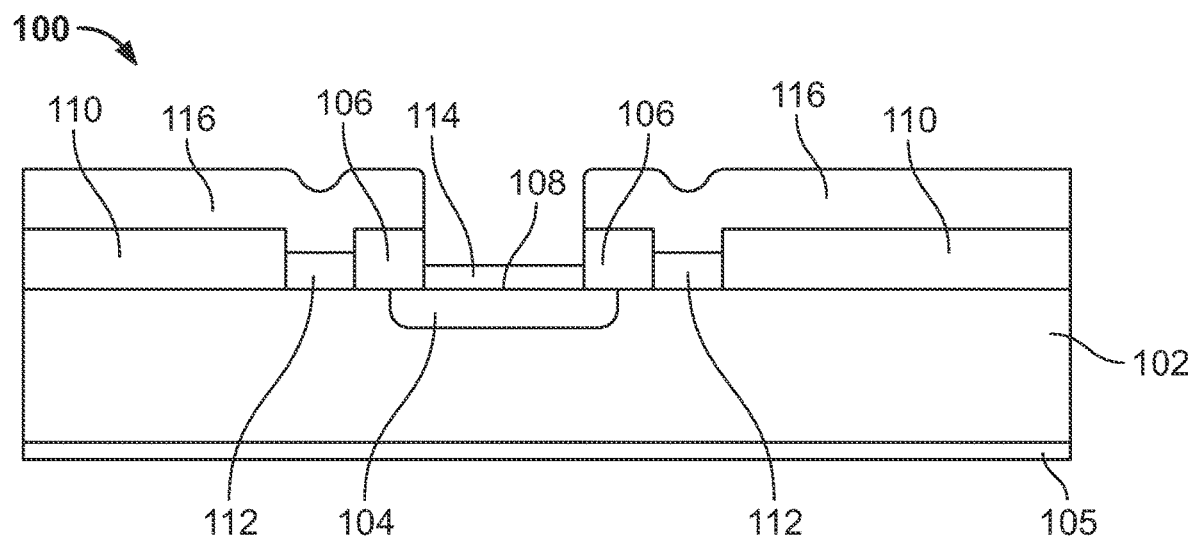
FIG. 1 is a schematic sectional side view of a photosensitive element according to an embodiment.

FIG. 1 shows in a schematic sectional view a photosensitive element 100 according to an example of the present disclosure. In the present example, the photosensitive element 100 comprises an avalanche photo diode (APD) which is fabricated in a wafer process in a silicon semiconductor substrate 102. The APD comprises a diode 104 which forms one single pixel of a detector unit of an optoelectronic component. The photosensitive element 100 may comprise further pixel diodes 104 integrated within the same substrate 102.

For electrically contacting the diode 104, an electrical contact 106 is provided. The electrical contact of the diode may for instance comprise a metal layer, such as for instance aluminum or a noble metal, e. g. platinum.

An electrically conductive layer is provided on the surface opposite to the active region 108 to serve as a backside contact 105.

In order to avoid light entering into the substrate 102 in the inactive regions surrounding the active region 108, a light shield layer 110 is arranged around the active region 108. The light shield layer 110 includes a metallization, e. g. an aluminum or platinum layer. However, other light shielding materials may also be used. If the light shielding layer 110 is electrically conductive, an electrically insulating layer 112 must be provided between the light shield layer 110 and the electrical contact 106. In case the photosensitive element 100 is fabricated as a CMOS (complementary metal oxide semiconductor) component, the electrically insulating layer 112 may be formed from silicon dioxide, in particular as a field oxide layer. In this example, the electrical contact 106 forms the anode and the light shield layer 110 forms the cathode of the avalanche diode.

The optically active region 108 is covered with an anti-reflective coating 114, as shown in FIG. 1. This anti-reflective coating 114, in an embodiment, has a transmittance of more than 99% for radiation in a spectral range between 300 nm and 1200 nm. In particular, the anti-reflective coating 114 has a transmittance of more than 99% for radiation in a spectral range between 500 nm and 1000 nm, or between 400 nm and 1000 nm. The material of this anti-reflective coating 114 may, for instance, be an optically transparent single layer or multi layer coating of two or more materials.

The anti-reflective coating 114 can be made with a method selected from the group comprising the atomic layer deposition method, the chemical vapor deposition method, plasma enhanced chemical vapor deposition method, physical vapor deposition, electron sputtering, ion beam sputtering, magnetron reactive sputtering and a combination thereof. The anti-reflective coating 114 may comprise at least one material selected from the group of oxide materials consisting of $Al_2O_3$, $TiO_2$, ZnO, $HfO_2$, HfSiO, $SiO_2$, MgO, $Ta_2O_5$, $ZrO_2$, and/or comprises at least one material selected from the group of nitride materials consisting of AlN, HfN, SiNx, $Si_3N_4$, TaN, TiN. Further, the anti-reflective coating 114 may comprise or consist of electrically conductive or semiconducting material(s) such as indium tin oxide (ITO).

According to the present disclosure, while the active region 108 is covered with an anti-reflective layer 114 having a particularly high transmittance, the remaining non-active regions are provided with a protective layer 116 which is anti-reflective and at the same time has a particularly low transmittance. In an embodiment, the protective layer 116 comprises an anti-reflective coating, which has in at least a part of a spectral range between 300 nm and 1200 nm a reflectivity of less than 10% and a transmittance of less than 0.1%. In an embodiment, the spectral range in which the anti-reflective coating has a reflectivity of less than 10% is essentially the same range in which the photosensitive element is sensitive. For some APDs, this may, for instance, be a spectral range between 500 nm and 1000 nm or between 400 nm and 1000 nm. The anti-reflective coating 114 may be referred to as a second anti-reflective coating to differentiate from the protective layer 116.

The protective layer 116 is particularly effective, if it covers at least one electrical contact 106 for contacting the photosensitive element 100 which is arranged in the peripheral region. The reason is that the electrical contacts 106 are made from metal and thus generate significant reflections when they are not covered.

By providing a layer which at the same time is anti-reflective and has a low transmittance, diffuse reflections of incoming radiation on the inactive regions can be avoided. Thus, the occurrence of ghost signals due to such internal reflections can be reduced or even completely avoided, resulting in an improved signal-to-noise ratio for single pixels as well as arrays of photosensitive elements. Furthermore, depending on the material chosen for the anti-reflective protective layer, the protective layer 116 may serve as an effective passivation which protects the underlying layers from corrosion and intrusion of humidity.

The protective layer 116 may for instance comprise a titanium/silicon dioxide layer and/or a titanium/tantalum pentoxide layer and/or a black resist layer. When the protective layer 116 comprises a titanium/silicon dioxide and/or a titanium/tantalum pentoxide layer, the protective layer 116 can serve as a passivation layer for the underlying metallization layers, i. e. the light shield layer 110 and the electrical contact 106.

The black resist layer may for instance be a black resist as described in the published European patent application EP 2466341 A1, paragraphs [0050] to [0197]. When the protective layer 116 is such a black resist layer, an additional passivation may be necessary. Moreover, the overall robustness against corrosion can also be improved in this case by using a noble metal (e. g. platinum) for the underlying metallization layers.

Figure 2:
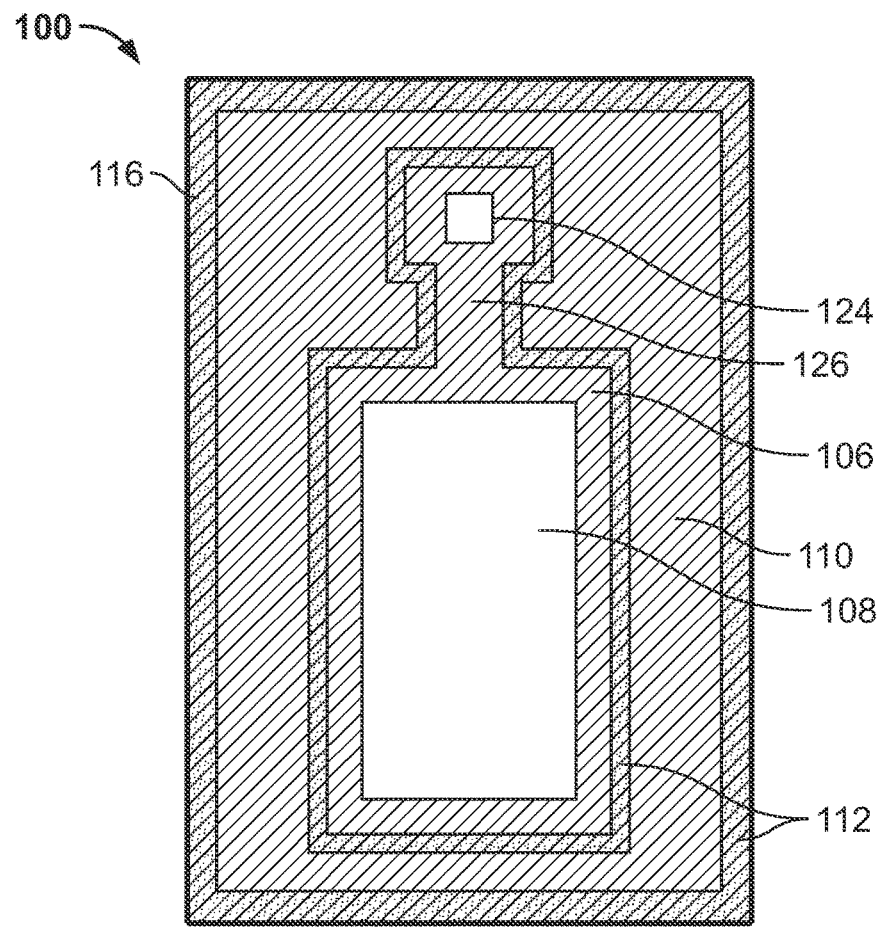
FIG. 2 is a schematic sectional top view of the photosensitive element.

FIG. 2 shows a schematic layout diagram of the photosensitive element 100 of FIG. 1 in a plan view. The same reference numerals are used for identical features. In an optically non-active region, a chip-side electrical connection 124, also referred to as a bond pad, is arranged. The chip-side electrical connection is connected to the electrical contact 106 via an electrically conductive connection structure 126. The chip-side electrical connection 124 is connected to a circuit carrier via a bond wire. The chip-side electrical connection 124 may comprise a metallization with aluminum and chromium layers in a multilayer structure. For instance, 1.1 μm Al may be covered by 60 nm Cr.

The electrically conductive connection structure 126 may comprise a metal layer of at least one metal selected from the following group: Al, Cr, Ti, W, Ni, V, an oxide of Al, Cr, Ti, W, Ni or V, and an alloy whose main component is Al, Cr, Ti, W, Ni or V. The electrically conductive connection structure 126 may comprise a single layer or a multilayer structure. In the case of a multilayer structure, the preceding design options apply accordingly to each of the layers in the stack. In the case of the multilayer structure, a metal layer may form the top layer. In one possible example, the layer stack may consist of two layers, for example an aluminum layer and a chromium layer arranged thereon.

Surrounding the optically active region 108, the light shield layer 110 is provided, as shown in FIG. 2. The light shield layer 110 is electrically insulated from the electrical contact 106 by electrically insulating layer 112, which is for instance formed by a field oxide. The light shield layer 110 has a transmittance of less than 0.1% for radiation in at least a part of a spectral range between 300 nm and 1200 nm. In an embodiment, the spectral range in which the light shield layer 110 has a transmittance of less than 0.1%, is essentially the same range in which the photosensitive element 100b is sensitive. For some APDs, this may for instance be a spectral range between 500 nm and 1000 nm, or 400 nm and 1000 nm. In an embodiment, the light shield layer 110 comprises an aluminum layer with a silicon dioxide/silicon nitride passivation layer, a chromium/gold layer, or a platinum layer.

According to the present disclosure, the complete surface of the photosensitive element 100 except the active region 108 is covered with a protective layer 116 as explained above. In order to not obscure the drawing of FIG. 2, the protective layer 116 is only schematically hinted at by a transparent hatching. It should be noted that the bond pad 124 may either be left open (as shown in the drawing) or may be covered by the protective layer 116. In the latter case, the protective layer 116 is opened in the course of the bonding process.

If the protective layer 116 is formed by a black resist, the structuring of the protective layer 116 can be achieved by any standard subtractive microstructuring process such as photolithography. Alternatively, also additive technologies, such as printing can be used. If the protective layer 116 comprises an inorganic black layer, such as a titanium/silicon dioxide layer and/or a titanium/tantalum pentoxide layer, the deposition and structuring may be performed by using electron and/or ion assisted deposition techniques. Also lift-off techniques may be used as appropriate and known in the art.

Figure 3:
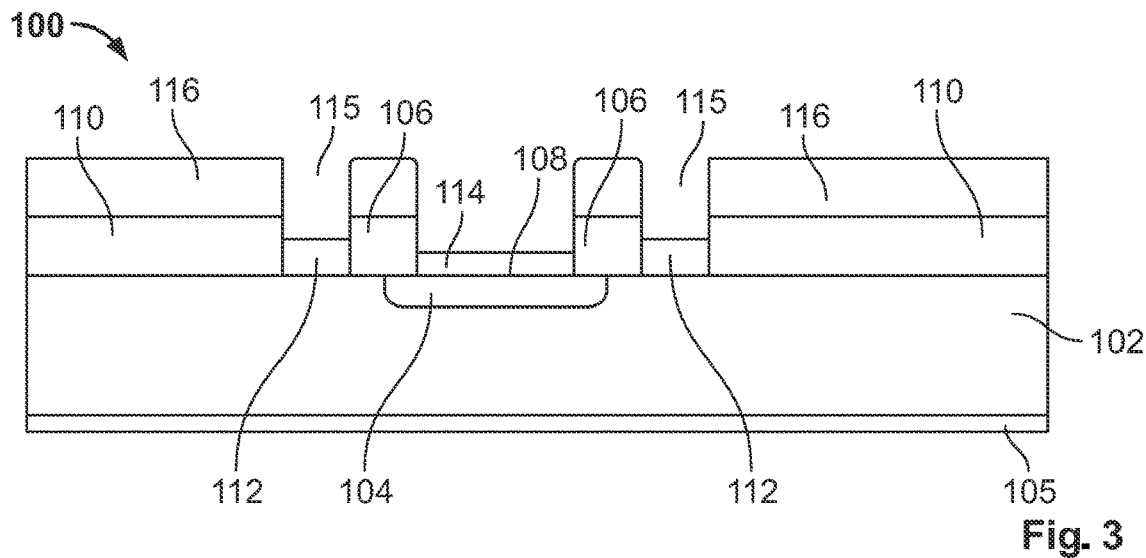
FIG. 3 is a schematic sectional side view of a photosensitive element according to another embodiment.

FIG. 3 shows a modification of the photosensitive element 100 of FIG. 1. In case the protective layer 116 is electrically conductive, it is important that the electrical contact 106 and the light shield layer 110 are not short circuited by the protective layer 116. As shown in FIG. 3, an electrically insulating gap 115 can be provided for separating the electrical contact 106 and the light shield layer 110 from each other.

Figure 4:
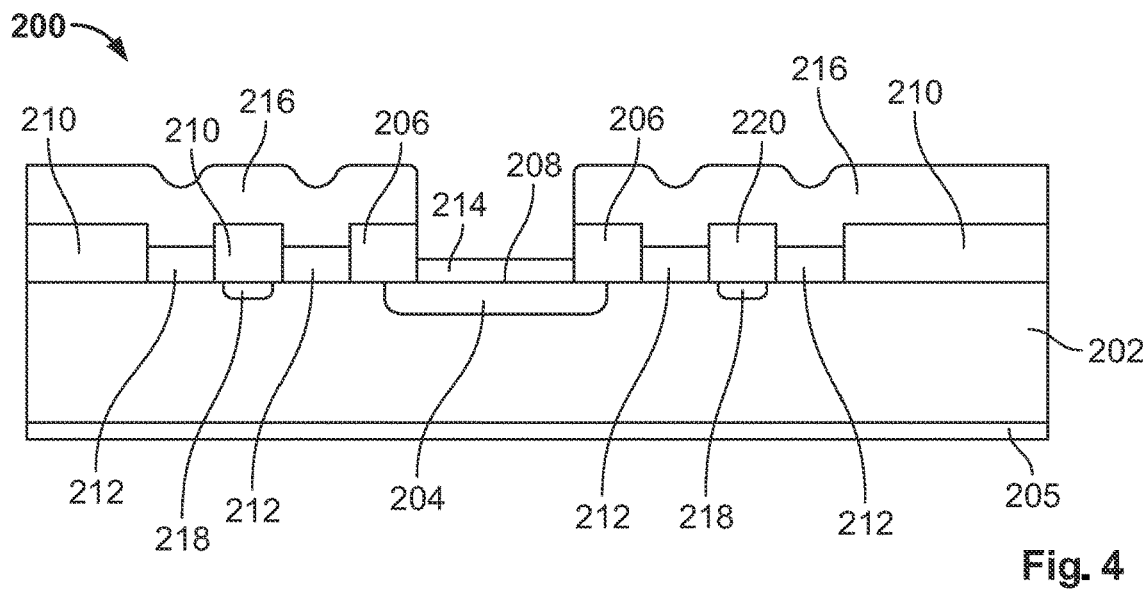
FIG. 4 is a schematic sectional side view of a photosensitive element according to another embodiment.

With reference to FIG. 4, an example of a photosensitive element 200 having a guard ring will be explained in the following.

As mentioned above, providing a guard ring is an effective method to prevent a premature breakdown of the avalanche diode. Accordingly, the photosensitive element 200 according to a further example of the present disclosure may further comprise a ring-shaped guard diode 218 surrounding the light sensitive region. In particular, an electrical contact 220 of the guard diode 218 may comprise a ring-shaped metallization which is covered by the protective layer 216. The guard diode 218 may have a circular ring shape, a polygonal ring shape, or any other suitable outline surrounding the light sensitive region.

In the present example, the photosensitive element 200 comprises an APD which is fabricated in a wafer process in a silicon semiconductor substrate 202. The APD comprises a diode 204 which forms one single pixel of a detector unit of an optoelectronic component. The photosensitive element 200 may comprise further pixel diodes 204, or an array, integrated within the same substrate 102. In particular for LIDAR applications, monolithic arrays of photosensitive elements are advantageous because of their compactness and accuracy.

For electrically contacting the diode 204, an electrical contact 206 is provided. The electrical contact 206 of the diode 204 may for instance comprise a metal layer, such as for instance aluminum or a noble metal, e. g. platinum.

An electrically conductive layer is provided on the surface opposite to the active region 208 to serve as a backside contact 205.

In order to avoid light entering into the substrate 202 in the inactive regions surrounding the active region 208, a light shield layer 210 is arranged around the active region 208. The light shield layer 210 may include a metallization, e. g. an aluminum or platinum layer. However, other light shielding materials may also be used.

The optically active region 208 is covered with an anti-reflective coating 214. This anti-reflective coating 214 has a transmittance of more than 99% for radiation in a spectral range between 300 nm and 1200 nm. In an embodiment, the anti-reflective coating 214 has a transmittance of more than 99% for radiation in a spectral range between 500 nm and 1000 nm. The material of this anti-reflective coating 214 may for instance be an optically transparent single layer or multi-layer coating of two or more materials, as this has been described above with reference to FIGS. 1 and 2.

Surrounding the electrical contact 206, a guard diode 218 is implanted in the substrate 202. The guard diode 218 is electrically contacted by a guard diode contact 220. The guard diode contact 220 may be formed by a metallization, for instance comprising aluminum or a noble metal like platinum.

Electrically insulating layers 212 provided between the light shield layer 210 and the guard diode contact 220, as well as between the guard diode contact 220 and the electrical contact 206. In case the photosensitive element 200 is fabricated as a CMOS component, the electrically insulating layer 212 may be formed from silicon dioxide, in particular as a field oxide layer.

As explained for the example shown in FIG. 1, while the active region 208 is covered with an anti-reflective layer 214 having a particularly high transmittance, the remaining non-active regions are provided with a protective layer 216 which is anti-reflective and at the same time has a particularly low transmittance. In particular, the protective layer 216 may comprise an anti-reflective coating, which has in at least a part of a spectral range between 300 nm and 1200 nm a reflectivity of less than 10% and a transmittance of less than 0.1%. In an embodiment, the spectral range in which the anti-reflective coating has a reflectivity of less than 10% is essentially the same range in which the photosensitive element is sensitive. For some APDs, this may for instance be a spectral range between 500 nm and 1000 nm. By providing a layer which at the same time is anti-reflective and has a low transmittance, diffuse reflections of incoming radiation on the inactive regions can be avoided. Thus, the occurrence of ghost signals due to such internal reflections can be reduced or even completely avoided, resulting in an improved signal-to-noise ratio for single pixels as well as arrays of photosensitive elements. Furthermore, depending on the material chosen for the anti-reflective protective layer, the protective layer 216 may serve as an effective passivation which protects the underlying layers from corrosion and intrusion of humidity.

The protective layer 216 may for instance comprise a titanium/silicon dioxide layer and/or a titanium/tantalum pentoxide layer and/or a black resist layer. When the protective layer 216 comprises a titanium/silicon dioxide and/or a titanium/tantalum pentoxide layer, the protective layer 216 can serve as a passivation layer for the underlying metallization layers, i. e. the light shield layer 210, the guard diode contact 220, and the electrical contact 206.

Figure 5:
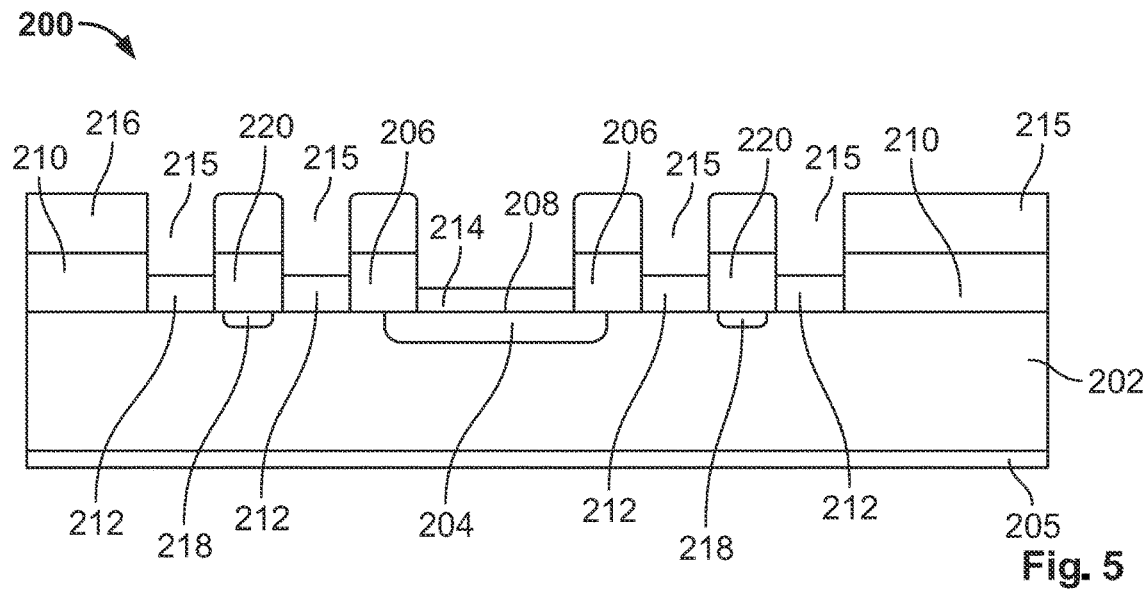
FIG. 5 is a schematic sectional side view of a photosensitive element according to another embodiment.

FIG. 5 shows a modification of the photosensitive element 200 of FIG. 4. In case the protective layer 216 is electrically conductive, it is important that the electrical contact 206, the guard diode contact 220, and the light shield layer 210 are not short circuited by the protective layer 216. As shown in FIG. 5, electrically insulating gaps 215 can be provided for separating the electrical contact 206, the guard diode contact 220, and the light shield layer 210 from each other.

Figure 6:
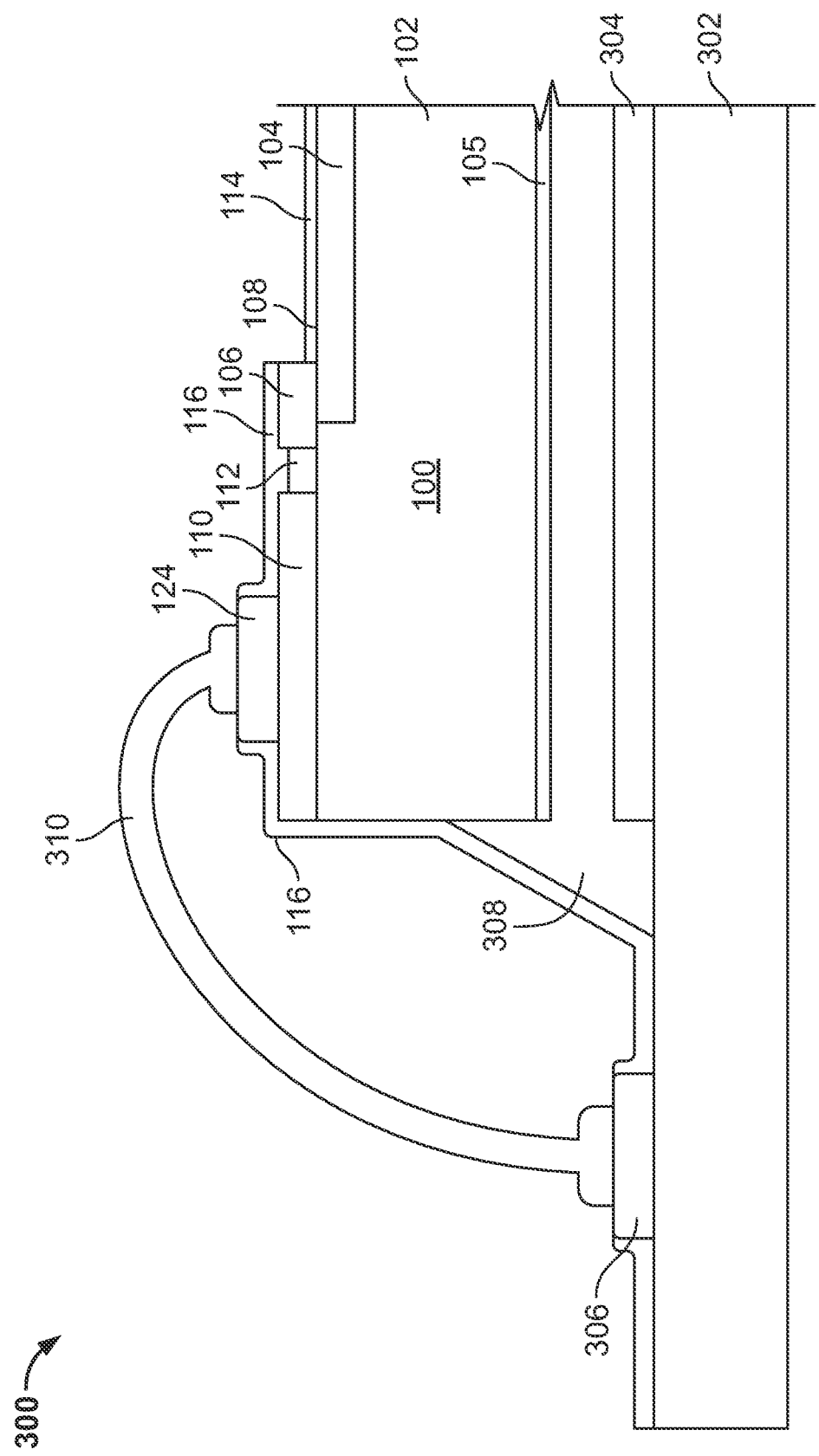
FIG. 6 is a schematic sectional side view of a part of an optoelectronic component according to an embodiment.

FIG. 6 illustrates in a schematic sectional view an optoelectronic component 300 according to a first example of the present disclosure. Although in this Figure, a photosensitive element 100 without guard diode is shown, it is clear that also the photosensitive element 200 having a guard diode as shown in FIG. 4 may be used.

The optoelectronic component 300 comprises a circuit carrier 302 which can be formed by a printed circuit board (PCB), a flexible circuit carrier, a ceramic circuit board such as a direct copper bonding (DCB) substrate, or any other suitable carrier material. For example, the carrier 302 is a polymeric support substrate of polyimide (PI), polyethylene terephthalate (PET), polyethylene naphthalate (PEN) film, and/or FR4 laminate. Furthermore, the carrier 302 can be flexible or rigid, as well as a combination of several materials. For providing a compact, hermetically sealed detector unit, the optoelectronic component 300 may further comprise an at least partly transparent overmold.

In particular for LIDAR applications, the optoelectronic component 300 may further comprise at least one radiation source, such as a laser diode, for providing the radiation emitter and receiver in one compact unit.

The technologies according to the present disclosure can also be used advantageously for three-dimensional substrate structures, such as those produced by 3D printing or injection molding. Three-dimensional circuit carriers have injection-molded plastic components as the basic substrate, and conductor tracks are applied to their surfaces. The technology is referred to as Mechatronic Integrated Devices (MID). Three-dimensional circuit carriers combine mechanical and electronic functions in one component to reduce space requirements and weight.

A photosensitive element 100 (or 200, not shown in the Figure) is attached to the circuit carrier 302 by an adhesive 308 or a solder connection. The circuit carrier 302 comprises electrically conductive connections, such as bond pads 306 and electrically conductive leads 304 for being connected to the chip-side electrical connection 124 and the backside contact 105, respectively. Although FIG. 6 shows a bond connection 310, other suitable contacting elements may of course also be used.

According to the example shown in FIG. 6, the protective layer 116 is not only applied to the upper surface of the photosensitive element 100, but also to the side walls and the accessible surfaces of the circuit carrier 302 and the adhesive layer 308. In the example of FIG. 6, the optically active region 108 as well as the bond pads 124 and 306 are not covered by the protective layer 116. The bond connection 310 is established after the protective layer 116 has been deposited.

Figure 7:
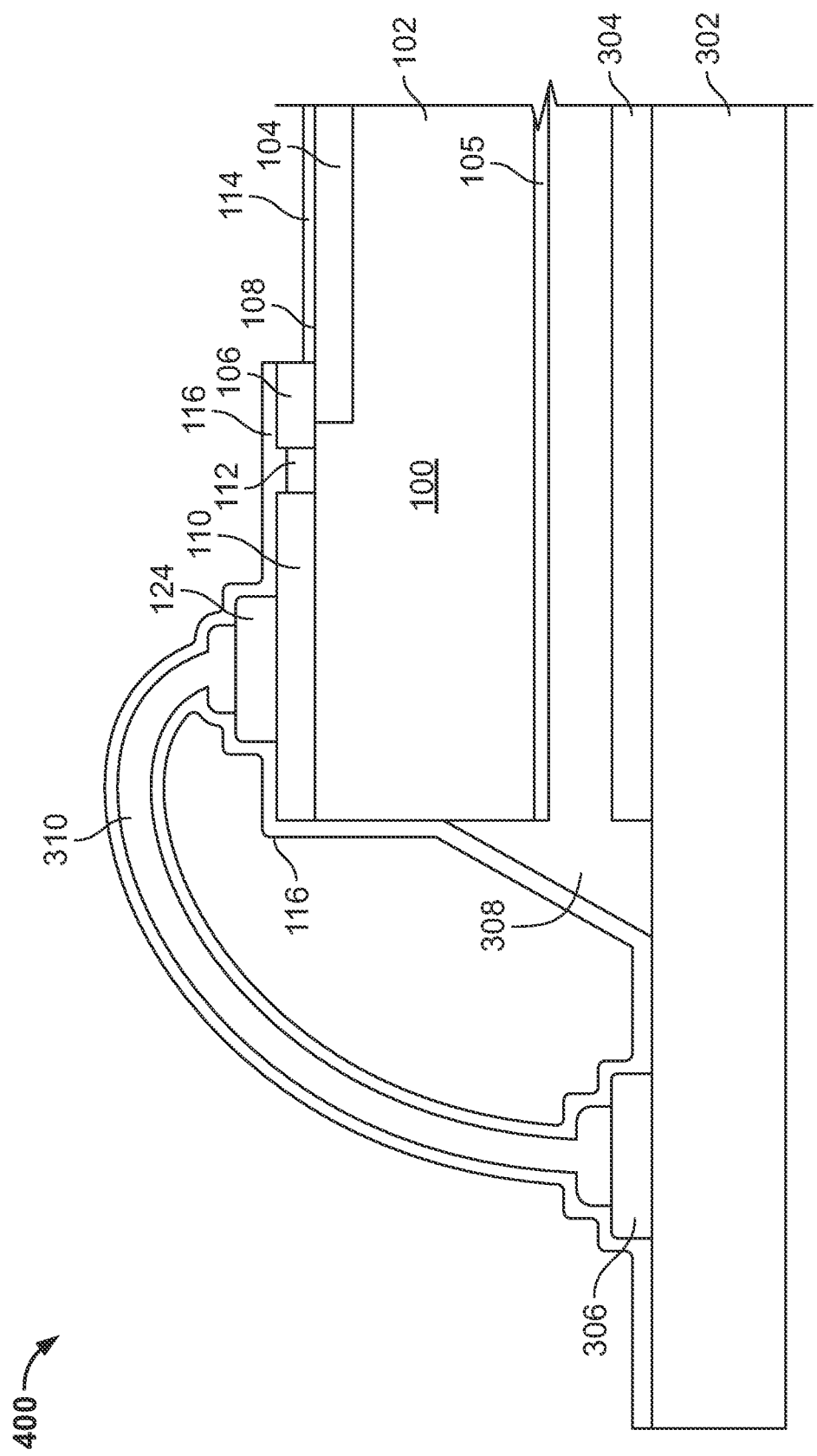
FIG. 7 is a schematic sectional side view of a part of an optoelectronic component according to another embodiment.

FIG. 7 illustrates an optoelectronic component 400 which is essentially identical to the optoelectronic component 300 shown in FIG. 6, with the exception that the protective layer 116 also covers the bond connection 310.

In summary, the present disclosure provides a solution to the problem of existing APDs, in which the non-active area of the detector is covered with a metal, leading to false positive signals and reduced signal-to-noise ratios. The source of such ghost signals is mainly that light is reflected diffusively by the metal into the optical active area. In this disclosure, various technologies are used to deposit an antireflective layer (high absorption) to cover the non-active area of the APD to eliminate >90% of the reflected light. Furthermore, the APD is designed and the layer stack is made such that it is potentially compatible with AECQ-102 qualification. By depositing a protective layer using e. g. sputtering or resist technology to cover the light shield metal with an anti-reflective coating, the SNR of the detector can be improved. This technology limits the effective synthetic enlargement of the detector by absorbing light in the non-active area and may also provide an effective passivation of the die.

The ideas of the present disclosure can be used advantageously with APDs, wherein the light sensitive region comprises an avalanche photodiode because of their extremely high sensitivity. However, also different photodetector concepts, such as Si photomultipliers, may profit from the solution provided by the present disclosure. For instance, the light sensitive region may form the light sensitive region of an avalanche photodiode (APD), of a single photon avalanche diode (SPAD), and/or of a photomultiplier (SiPM).

What is claimed is:
1. A photosensitive element, comprising:
a semiconductor substrate;
a light sensitive region formed in the semiconductor substrate;
an inactive region at least partly surrounding the light sensitive region; and
a protective layer having an opening leaving the light sensitive region uncovered by the protective layer, the protective layer is an anti-reflective coating having in at least a part of a spectral range between 300 nm and 1200 nm a reflectivity of less than 10% and a transmittance of less than 0.1%.

2. The photosensitive element of claim 1, further comprising a light shield layer arranged below the protective layer.

3. The photosensitive element of claim 2, wherein the light shield layer has a transmittance of less than 0.1% for radiation in at least a part of a spectral range between 300 nm and 1200 nm.

4. The photosensitive element of claim 1, further comprising an electrical contact for contacting the photosensitive element arranged in a peripheral region.

5. The photosensitive element of claim 4, wherein the electrical contact has a ring-shaped metal layer surrounding the light sensitive region.

6. The photosensitive element of claim 1, wherein the light sensitive region is part of an avalanche photodiode of a single photon avalanche diode and/or of a photomultiplier.

7. The photosensitive element of claim 1, further comprising a second anti-reflective coating covering the light sensitive region.

8. The photosensitive element of claim 7, wherein the second anti-reflective coating has a transmittance of more than 99% for radiation in at least a part of a spectral range between 300 nm and 1200 nm.

9. The photosensitive element of claim 1, wherein the protective layer is a titanium/silicon dioxide layer and/or a titanium/tantalum pentoxide layer and/or a black resist layer.

10. The photosensitive element of claim 2, wherein the light shield layer is an aluminum layer with a silicon dioxide/silicon nitride passivation layer, a chromium/gold layer, or a platinum layer.

11. The photosensitive element of claim 1, further comprising a ring-shaped guard diode surrounding the light sensitive region.

12. The photosensitive element of claim 11, wherein an electrical contact of the ring-shaped guard diode is a ring-shaped metallization and is covered by the protective layer.

13. The photosensitive element of claim 1, wherein the light sensitive region is part of an array of light sensitive regions.

14. An optoelectronic component, comprising:
   a photosensitive element including a semiconductor substrate, a light sensitive region formed in the semiconductor substrate, an inactive region at least partly surrounding the light sensitive region, and a protective layer having an opening leaving the light sensitive region uncovered by the protective layer, the protective layer is an anti-reflective coating having in at least a part of a spectral range between 300 nm and 1200 nm a reflectivity of less than 10% and a transmittance of less than 0.1%; and
   a carrier, the semiconductor substrate is attached to the carrier and the carrier electrically contacts a backside contact of the semiconductor substrate.

15. The optoelectronic component of claim 14, further comprising an at least partly transparent overmold.

16. The optoelectronic component of claim 14, further comprising a radiation source.

17. The optoelectronic component of claim 16, wherein the radiation source is a laser diode.

* * * * *